(12) United States Patent
Huang et al.

(10) Patent No.: US 12,487,483 B2
(45) Date of Patent: Dec. 2, 2025

(54) DISPLAY DEVICE

(71) Applicant: AUO Corporation, Hsin-Chu (TW)

(72) Inventors: Ying-Lun Huang, Hsin-Chu (TW);
Yi-Cheng Hsiao, Hsin-Chu (TW);
Chih-Wei Chien, Hsin-Chu (TW)

(73) Assignee: AUO CORPORATION, Hsin-Chu (TW)

( * ) Notice: Subject to any disclaimer, the term of this patent is extended or adjusted under 35 U.S.C. 154(b) by 0 days.

(21) Appl. No.: 18/672,062

(22) Filed: May 23, 2024

(65) Prior Publication Data

US 2025/0231435 A1 Jul. 17, 2025

(30) Foreign Application Priority Data

Jan. 15, 2024 (TW) .................................. 113101540

(51) Int. Cl.
*G02F 1/1333* (2006.01)
*G02F 1/1335* (2006.01)
*G02F 1/1339* (2006.01)
*H10K 59/18* (2023.01)
*H10K 59/80* (2023.01)

(52) U.S. Cl.
CPC .... *G02F 1/13336* (2013.01); *G02F 1/133528* (2013.01); *G02F 1/13394* (2013.01); *G02F 1/13398* (2021.01); *H10K 59/18* (2023.02); *H10K 59/8793* (2023.02)

(58) Field of Classification Search
CPC ............. G02F 1/13336; G02F 1/13398; G02F 1/133602; G02F 1/133608; G02F 1/133305; H10K 59/8793; H01L 27/3293; G09F 9/3026
See application file for complete search history.

(56) References Cited

U.S. PATENT DOCUMENTS 8,077,395 B2   12/2011   Kashiwagi et al.
9,246,125 B2   1/2016    Cho et al.
(Continued)

FOREIGN PATENT DOCUMENTS

JP   2005-091873        4/2005
KR   10-2010-0056529 A  5/2010
(Continued)

OTHER PUBLICATIONS

Machine Language Translation of Patent Publication No. JP2013222029 (Year: 2013).*
(Continued)

*Primary Examiner* — Angela M. Medich
(74) *Attorney, Agent, or Firm* — WPAT, PC (57) ABSTRACT

A display device includes a base, a display panel, and a spacer. The display panel is disposed on the base and has a back surface. The back surface has a central area and a peripheral area closer to the edge of the display panel than the central area. The shortest distance between the central area and the base is greater than the shortest distance between the peripheral area and the base. The spacer is disposed between the base and the back surface corresponding to the central area. The spacer is disposed to raise the central portion of the display panel relative to the edge of the display panel, so the arching configuration of the display panel prevents the edge of the display panel from warping.

17 Claims, 7 Drawing Sheets

(56) References Cited

U.S. PATENT DOCUMENTS

| | | | |
|---|---|---|---|
| 2005/0157516 A1* | 7/2005 | Chen | G02B 6/0085 |
| | | | 362/555 |
| 2010/0079687 A1* | 4/2010 | Furuta | H04N 9/3167 |
| | | | 349/5 |
| 2024/0153966 A1* | 5/2024 | Choi | H01L 24/16 |

FOREIGN PATENT DOCUMENTS

| KR | 10-2014-0143634 A | 12/2014 |
|---|---|---|
| KR | 10-2020-0083118 A | 7/2020 |

OTHER PUBLICATIONS

Korean Intellectual Property Office Office Action on Sep. 8, 2025.

\* cited by examiner

DISPLAY DEVICE

CROSS-REFERENCE TO RELATED APPLICATION

This application claims the priority benefits of Taiwan patent application serial no. 113101540, filed on Jan. 15, 2024. The entirety of the mentioned above patent application is hereby incorporated by reference herein and made a part of this specification.

BACKGROUND OF THE DISCLOSURE

1. Field of the Disclosure

The present disclosure relates to a display device; specifically, the present disclosure relates to a display device that improves the taste of spliced display images.

2. Related Art

With the continuous advancement of display technology, the product maturity of various display panels is also increasing. Whether it is a liquid crystal display panel, an organic light-emitting diode display panel, or a micro-light-emitting diode display panel, they all have a long-term development in technology. However, in the development of large-size display technology, in addition to using a single large-size panel, the use of spliced panels to form a large-size display device is also one of the current mainstream technology.

However, after long-term use of a large-size display device composed of spliced panels, warpage may occur at the periphery of each spliced display panel due to the manufacturing method of the display panel, the continuous maturation of the glue material, the hardness of the glue material, etc. There will be light leakage at the periphery of the warped display panel, which will degrade the quality of the bright and dark images, thereby affecting the user experience. In addition, the warped periphery of the display panel may also be observed by users due to the bulging edges, affecting the overall appearance of the display device.

SUMMARY OF THE DISCLOSURE

In order to solve the above problems, according to an embodiment of the present disclosure, a display device is provided, which includes a base, a display panel, and at least one spacer. The display panel is disposed on the base, wherein the display panel has a back surface. The back surface has a central area and a peripheral area, which is closer to the edge of the display panel than the central area. The shortest distance between the central area and the base is greater than the shortest distance between the peripheral area and the base. The at least one spacer is provided between the base and the back surface corresponding to the central area.

Another embodiment of the present disclosure provides a display device, which includes a base, a first display panel disposed on the base, and a second display panel disposed on the base, wherein a first side of the first display panel and a second side of the second display panel are in contact with each other, and the central portions of the first display panel and the second display panel are respectively raised relative to the base compared to the first side and the second side.

Another embodiment of the present disclosure provides a display device including a base, a first display panel disposed on the base, and a second display panel disposed on the base, wherein a first side of the first display panel and a second side of the second display panel are in contact with each other. The portion of the first display panel closer to the first side and the portion of the second display panel closer to the second side are combined to form a groove, which extends along the first side and the second side and has a wider top and a narrower bottom.

The display device provided according to various embodiments of the present disclosure can improve the taste of light and dark images and reduce the conspicuousness of the edges and splicing lines of the display panel, thereby improving the user's viewing experience and the overall aesthetic appearance.

DETAILED DESCRIPTION OF THE PREFERRED EMBODIMENT

Various embodiments will be described below, and those with ordinary skill in the art can easily understand the spirit and principles of the present disclosure by referring to the description and drawings. However, although certain embodiments are described in detail herein, these embodiments are illustrative only and are not to be considered restrictive or exhaustive in any respect. Therefore, various changes and modifications to the present disclosure should be obvious and easily achievable to those of ordinary skill in the art without departing from the spirit and principles of the disclosure.

In the drawings, the thickness of layers, films, panels, regions, etc., are exaggerated for clarity. Throughout this specification, the same reference symbols refer to the same elements. It will be understood that when an element such as a layer, film, region or substrate is referred to as being "on" or "connected to" another element, it can be directly on or connected to the other element, or Intermediate elements may also be present. In contrast, when an element is referred to as being "directly on" or "directly connected to" another element, there are no intervening elements present. As used herein, "connected" may refer to physical and/or electrical connection. Furthermore, "electrical connection" or "coupling" may mean the presence of other components between two components.

The terminology used herein is for the purpose of describing particular embodiments only and is not intended to be limiting. As used herein, the singular forms "a", "an" and "the" are intended to include the plural forms including "at least one" unless the content clearly dictates otherwise. "Or" means "and/or". As used herein, the term "and/or" includes any and all combinations of one or more of the associated listed items. It will also be understood that when used in this specification, the terms "comprising" and/or "including" designate the presence or addition of stated features, regions, integers, steps, operations, elements and/or parts, but do not exclude the presence or addition of one or The presence or addition of various other features, regions, integers, steps, operations, elements, parts and/or combinations thereof.

Exemplary embodiments are described herein with reference to cross-sectional illustrations that are schematic illustrations of idealized embodiments. Accordingly, variations in the shape of the illustrations, for example as a result of manufacturing techniques and/or tolerances, are to be expected. Thus, embodiments described herein should not be construed as limited to the particular shapes of regions illustrated herein but are to include deviations in shapes that result, for example, from manufacturing. For example, regions shown or described as flat may typically have rough and/or non-linear characteristics. Additionally, the acute angles shown may be rounded. Accordingly, the regions shown in the figures are schematic in nature and their shapes are not intended to illustrate the precise shapes of the regions and are not intended to limit the scope of the claims.

Figure 1:
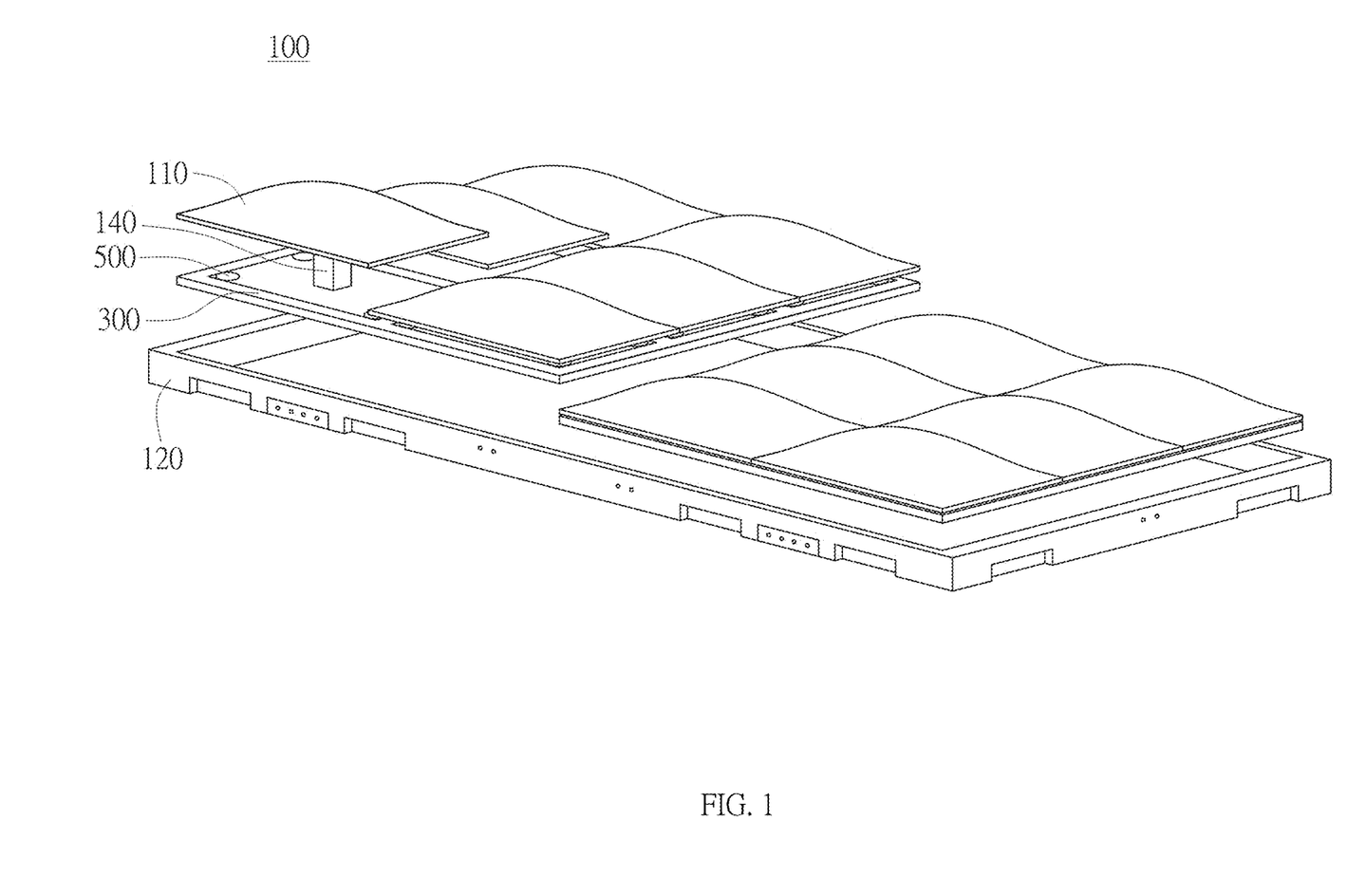
FIG. 1 is an exploded schematic view of a display device according to an embodiment of the present disclosure.

As shown in FIG. 1, in this embodiment, the display device 100 includes a base 120, a display panel 110, and a spacer 140. The display panel 110 is disposed on the base 120, and the spacer 140 is disposed between the base 120 and the display panel 110 to raise the central portion of the display panel 110. Thereby, the central portion of the display panel 110 can be convex relative to the surrounding edge portions, so the outer surface (e.g. the display surface) of the display panel 110 is bulged to form a convex arched surface, such as a slightly convex turtle-back shape. In this embodiment, the base 120 can be a light box for assembly and splicing of the display device 100. In addition, this embodiment further includes a submount 300, and the display panel 110 is disposed on the submount 300, and then disposed on the base 120 through submount 300. The display panel 110 is preferably a micro-light-emitting diode display panel, but not limited thereto. The display panel 110 may be an organic light-emitting diode display panel, a liquid crystal display panel, or other types of display panels. With this design, multiple display panels 110 can be spliced to form a large display device.

Figure 2:
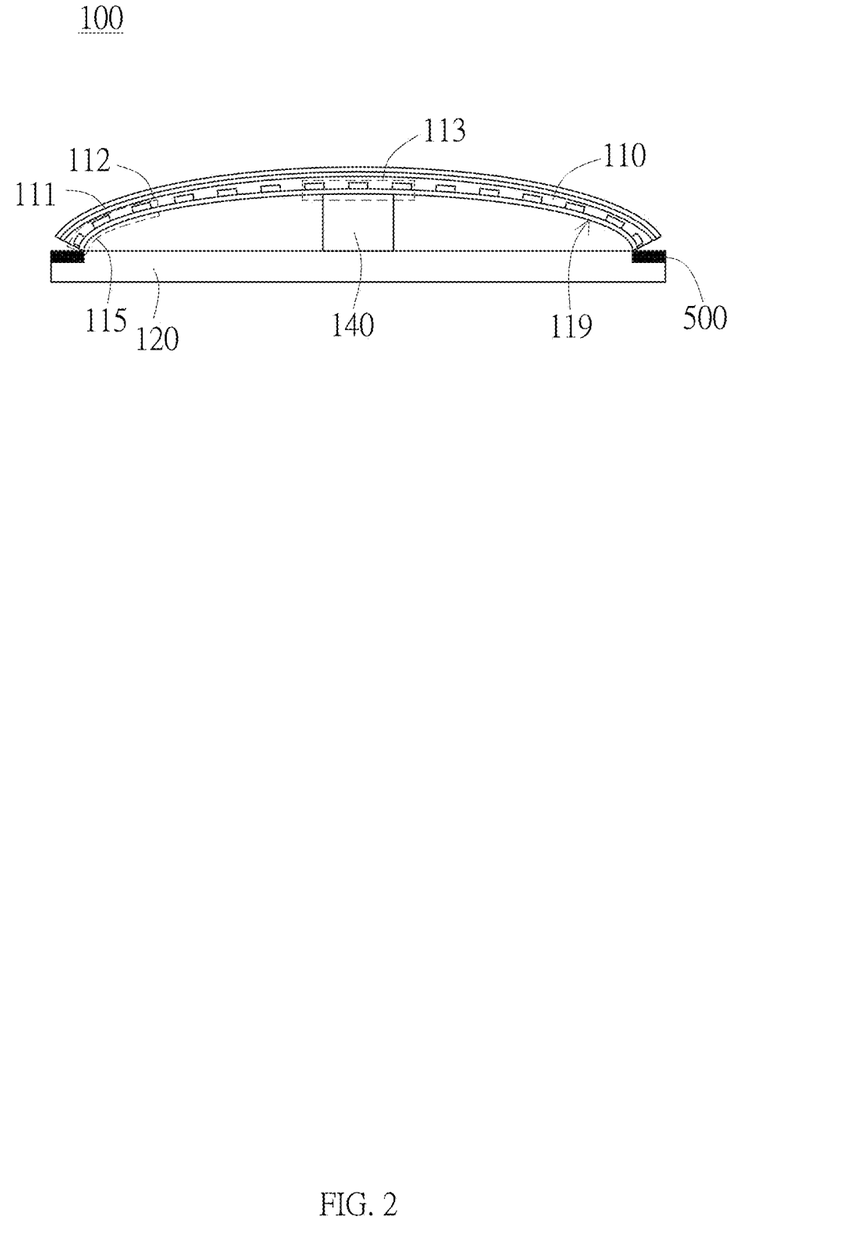
FIG. 2 is a cross-sectional view of a display device according to another embodiment of the present disclosure.

FIG. 2 takes a single display panel 110 as an example for illustration. In this embodiment, the display panel 110 can be directly connected to the base 120 instead of being indirectly assembled to the base 120 through the submount 300. The display panel 110 has a back surface 119, and the back surface 119 has a central area 113 and a peripheral area 115. The peripheral area 115 is closer to the edge of the display panel 110 than the central area 113. The shortest distance between the central area 113 and the base 120 is greater than the shortest distance between the peripheral area 115 and the base 120. In this embodiment, the end of the peripheral area 115 is the end edge of the display panel 110, which is connected to the base 120, so the shortest distance between the peripheral area 115 and the base 120 is 0. In addition, when the side of the base 120 facing the display panel 110 is a non-flat surface, such as the surface of the base 120 provided with a structure of an assembly mechanism or a side wall, the most protruding point or the most recessing point of the base 120 relative to the display panel 110 can be used as a reference point to form a virtual reference plane, and the distance of the central area 113 (or the peripheral area 115) of the display panel 110 relative to the base 120 is measured based on the virtual reference plane.

As shown in FIG. 1 and FIG. 2, the display device may include a plurality of connecting members 500. The connecting members 500 are disposed on the base 120 or the submount 300 and configured to connect and position the back surface 119 of the display panel 110 and the upper surface of the base 120 or the submount 300. In this embodiment, the connecting members 500 may include a strong magnet and an iron piece, which are respectively disposed on the base 120 (or the submount 300) and the display panel 110 to position the display panel 110 and the base 120 (or the submount 300) through magnetic force. However, in different embodiments, the connecting member 500 may be a locking screw or hook to achieve the connection effect in a locking manner. In addition, in this embodiment, the connecting member 500 is embedded in the surface of the base 120; however, in different embodiments, the connecting member 500 can protrude from the surface of the base 120, so the distance between the peripheral area 115 of the display panel 110 and the base 120 is increased.

The position of the spacer 140 corresponds to the central area 113. For example, one end of the spacer 140 can directly or indirectly contact the central area 113. The other end of the spacer 140 can be directly or indirectly connected to the base 120. In one embodiment, the distance between the central area 113 of the display panel 110 and the base 120 may be within 200 μm, and the distance between the peripheral area 115 and the base 120 may be within 50 μm. Thereby, the central area 113 of the display panel 110 can be raised relative to the peripheral area 115, to reduce the occurrence of outward warpage of the side edge of the display panel 110 that affects the appearance of the product and affects the viewing quality.

The spacer 140 can be a column made of an elastic object, such as a rubber column. In one embodiment, the spacer 140 includes an elastomer, and the Shore A hardness of the spacer 140 is 50±5 (i.e., between 45 and 55). In another embodiment, the compression amount of the spacer 140 may be about 5%, preferably less than or equal to 5%. Through the arrangement of the spacer 140, the display panel can be adjusted, so the shortest distance between the central area and the base is greater than the shortest distance between the peripheral area and the base, and the circuit traces behind the display panel are prevented from being scratched to cause a short circuit. In different embodiments, the spacer 140 can be an adjustment screw, and the protruding length relative to the base 120 or the display panel 110 can be adjusted.

Figure 3A:
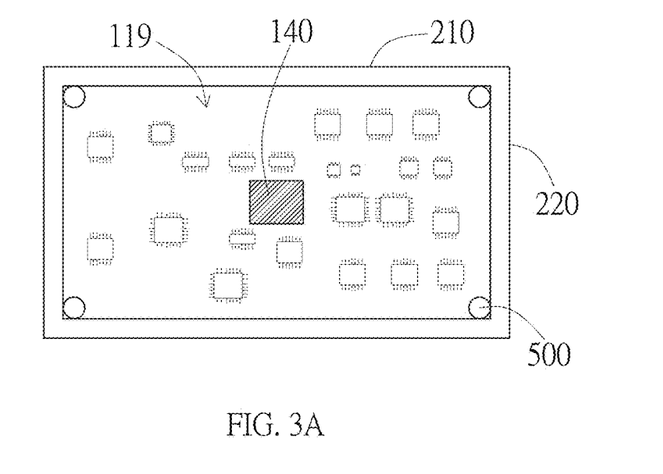
FIGS. 3A to 3C are top views of the back surface of the display panel according to different embodiments.
Figure 3B:
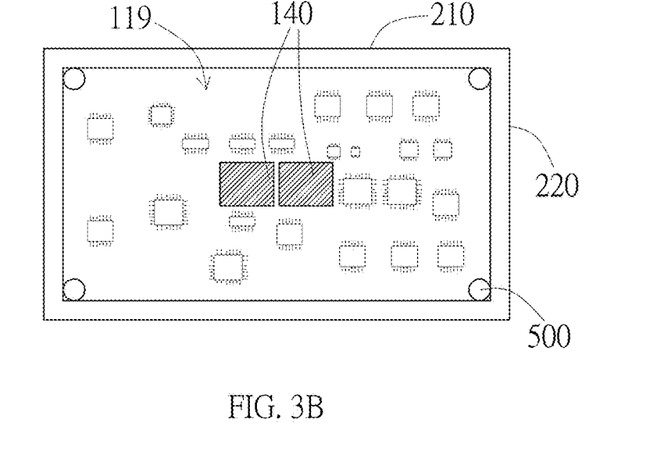
Figure 3C:
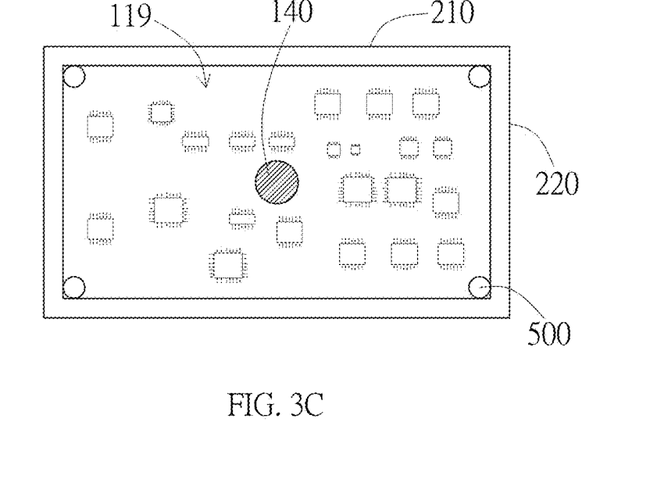

As shown in FIGS. 3A to 3C, the cross-sectional shape of the spacer 140 may be rectangular, circular or polygonal. In addition, the position where the spacer 140 is in contact with the back surface 119 of the display panel 110 is preferably a position of the back surface 119 with no circuit component installed to reduce the chance of occurrence of circuit problems. In the embodiments of FIG. 3A and FIG. 3C, a single spacer 140 is provided for each display panel 110, and in the embodiment of FIG. 3B, two spacers 140 are provided and arranged side by side in the direction along the long side of the display panel 110. In other words, the number of spacers 140 is not limited to one.

As shown in FIG. 2, the display panel 110 may include a functional layer 111 provided at the light-exit side in the light-exit direction. The functional layer 111 may have an anti-glare anti-reflective (AGAR) structure, an anti-reflective (AR) structure, an anti-glare low-reflective (AGLR) structure, an anti-glare (AG) structure, or other structures. The display panel 110 may also have an optical layer 112 such as polarizing material or spectrum absorption material at the light-exit side. The polarizing material can be a polarizer or a phase deviation film. In one embodiment, the optical layer 112 made of the polarizing material has a transmittance of 40% to 60% in the light-exit direction. In another embodiment, the optical layer 112 made of the spectral absorption material has a transmittance of 20% to 70% in the light-exit direction. Through the above arrangement, the overall blackening degree of the display panel 110 can be higher; relatively speaking, the reduction in warpage caused by the bulging of the central area 113 of the display panel 110 has a greater effect on improving viewing quality.

Figure 4A:
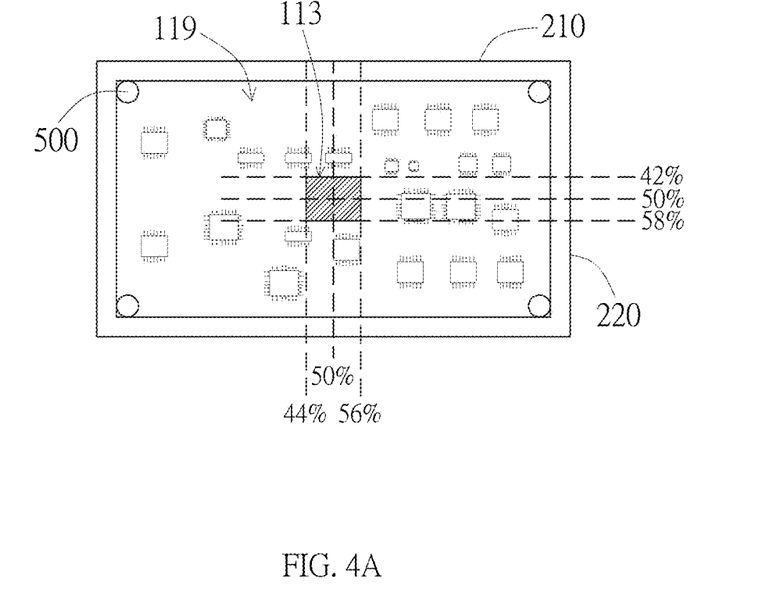
FIG. 4A and FIG. 4B are schematic views of the location of the central area according to different embodiments.
Figure 4B:
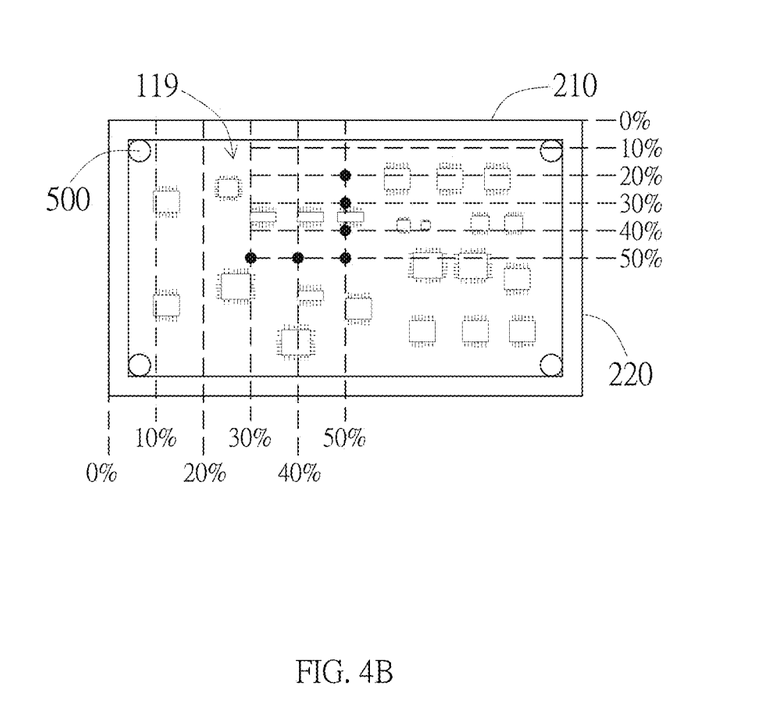

As shown in FIG. 4A, the back surface 119 of the display panel 110 is rectangular, and the central area 113 is located in a range of 42-58% of the length of the short side 220 from the edge of the long side 210 and 44-56% of the length of the long side 210 from the edge of the short side 220. In other words, the spacer 140 can contact the back surface 119 at a position within 42-58% of the middle section in the direction of the short side 220 and 44-56% of the middle section in the direction of the long side 210. In another embodiment, as shown in FIG. 4B, when the number of spacer 140 is one, the central area 113 is located within 20% of the middle section of the back surface 119, i.e., a range of 10% extending outward from the center point of the back surface 119 in different directions, and the best effect can be achieved. When the number of spacers 140 is plural, or the display panel 110 is equipped with components or other circuit traces on the back surface 119, so the center cannot give way to the spacer 140, the location of the central area 113 can be within 40% of the middle section of the surface width of the back surface 119, i.e., within the range of 20% extending outward from the center point of the back surface 119 in different directions, and a better effect can be achieved. The above-mentioned "surface width" may preferably include the widest cross-sectional width of the back surface 119 or the cross-sectional width passing through the centroid, but is not limited thereto.

Figure 5A:
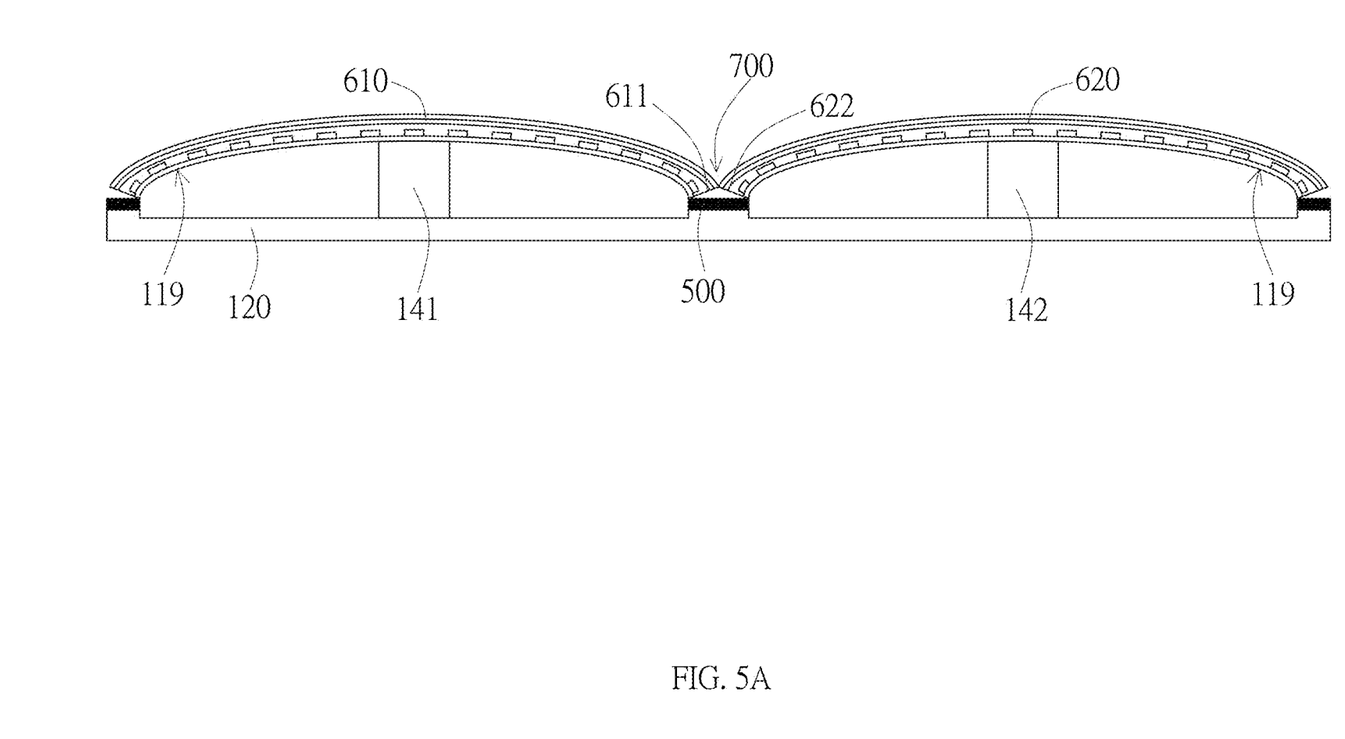
FIG. 5A and FIG. 5B are cross-sectional views of the display device of another embodiment.

In the embodiment shown in FIG. 5A, the display device has a first display panel 610 and a second display panel 620 adjacent to each other. The first display panel 610 and the second display panel 620 are arranged side by side on the base 120, and the first side 611 of the first display panel 610 and the second side 622 of the second display panel 620 are in contact with each other. As shown in FIG. 5A, the central portions of the first display panel 610 and the second display panel 620 are respectively raised relative to the base 120 compared to the first side 611 and the second side 622. In this embodiment, the central portions of the first display panel 610 and the second display panel 620 are raised through the arrangement of the spacers 141 and 142; however, in other embodiments, other methods may be used, such as extrusion, magnetic attraction, etc., to cause the central portions of the first display panel 610 and the second display panel 620 to bulge. In addition, as shown in FIG. 5A, the portion of the first display panel 610 close to the first side 611 and the portion of the second display panel 620 close to the second side 622 are combined to form a groove 700, which extends along the first side 611 and the second side 622 (i.e., perpendicular to the paper surface) and has a wider top and a narrower bottom. When a plurality of display panels are arranged in a matrix, the grooves 700 will be distributed in a plurality of rows and columns. This can reduce the occurrence of outward warpage of the first side 611 of the first display panel 610 and the second side 622 of the second display panel 620, that affects the viewing quality.

Figure 5B:
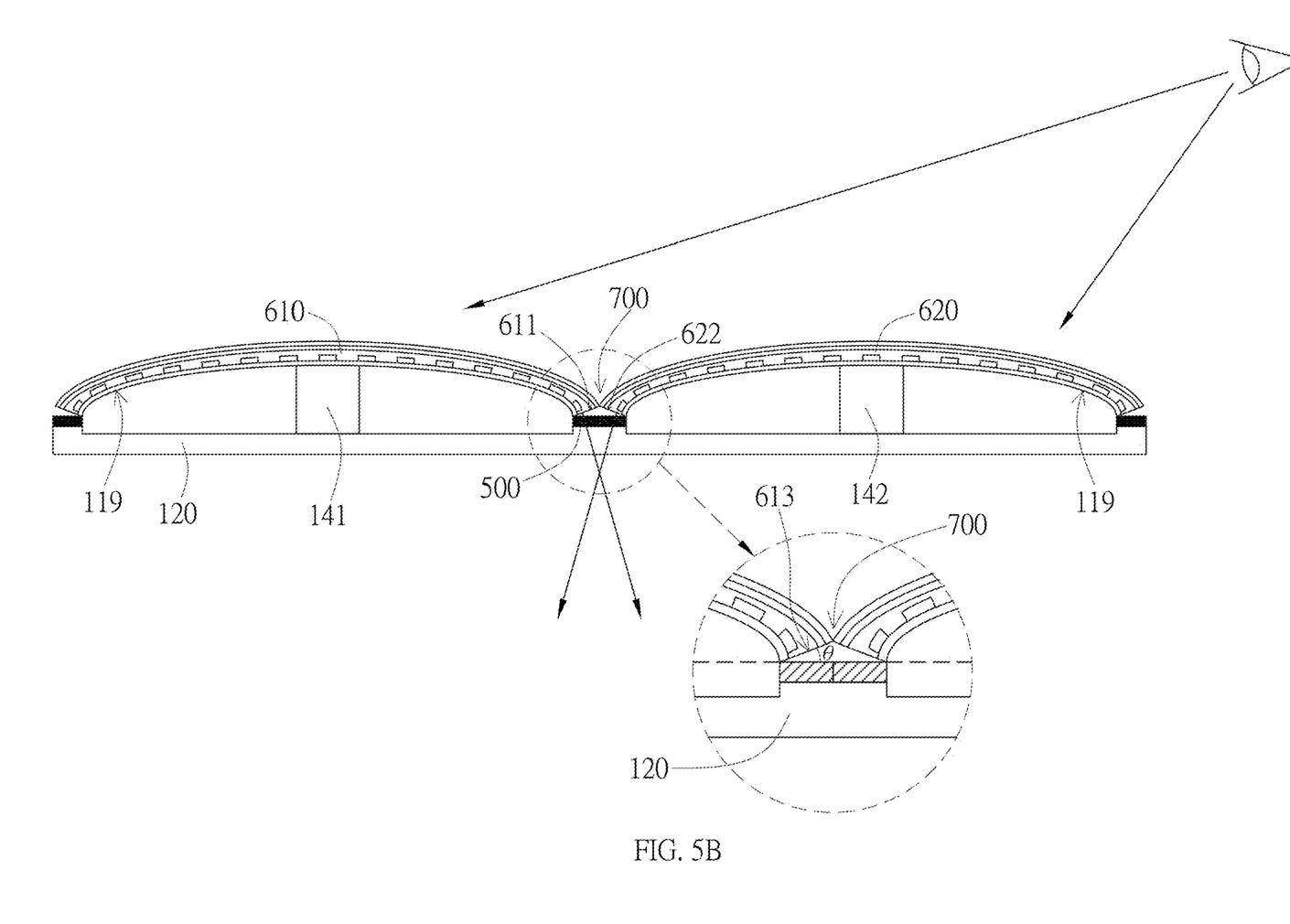

As shown in FIG. 5B, the first side 611 of the first display panel 610 has a first end surface 613, which is originally perpendicular to the back surface 119 before the first display panel 610 is assembled. When the first display panel 610 is assembled, the first end surface 613 is inclined relative to the base 120 toward the direction opposite to the image display direction of the first display panel 610 (i.e., the opposite direction of the back surface 119). In other words, the first end surface 613 originally orientates perpendicular to the extension plane of the base 120 and then rotates toward the extension plane where the base 120 is located to form an acute angle θ with the extension plane where the base 120 is located. With this arrangement, the edge of the display panel can emit light in a non-line-of-sight direction, preventing bright lines from appearing on the splicing line between adjacent display panels, thereby improving the quality of dark images.

In addition, in the embodiment of FIG. 5A and FIG. 5B, the connecting member 500 is disposed to protrude from the base 120. In this embodiment, the extension plane where the base 120 is located is a virtual plane, which may be, for example, the plane formed by the top points of the sides of the base 120, or the plane where the main bottom plate of the base 120 is located.

Figure 6:
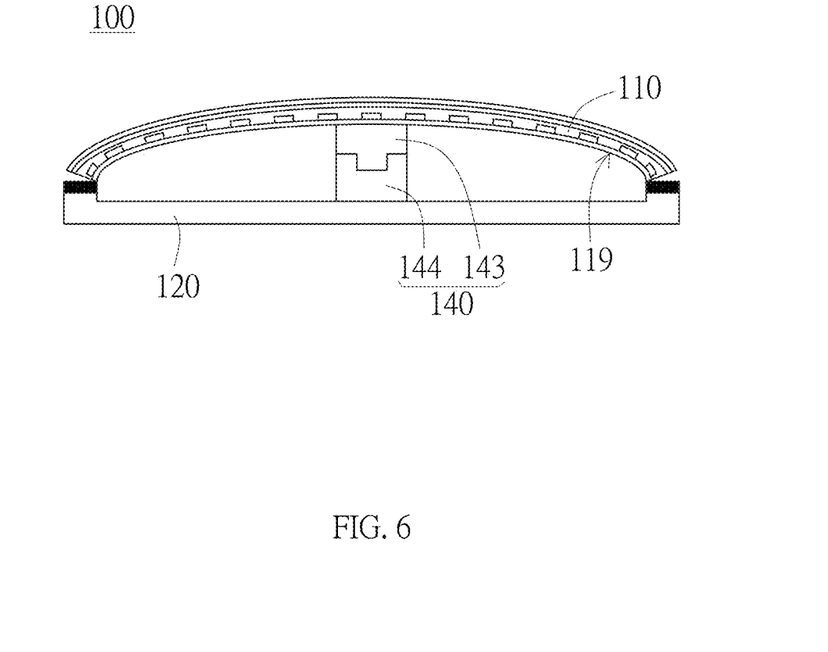
FIG. 6 is a cross-sectional view of the display device of another embodiment.

In another embodiment shown in FIG. 6, the spacer 140 may include a first connecting member 143 and a second connecting member 144 electrically connected to each other. The first connecting member 143 and the second connecting member 144 can be the male head and the female head of the electrical connector, respectively. The first connecting member 143 is disposed on the back surface 119 of the display panel 110 and electrically connected to the circuit on the display panel 110. The second connecting member 144 is disposed on the base 120 and electrically connected to the circuit on the base 120. Through this arrangement, the spacer 140 can also have a signal transmission function.

Figure 7:
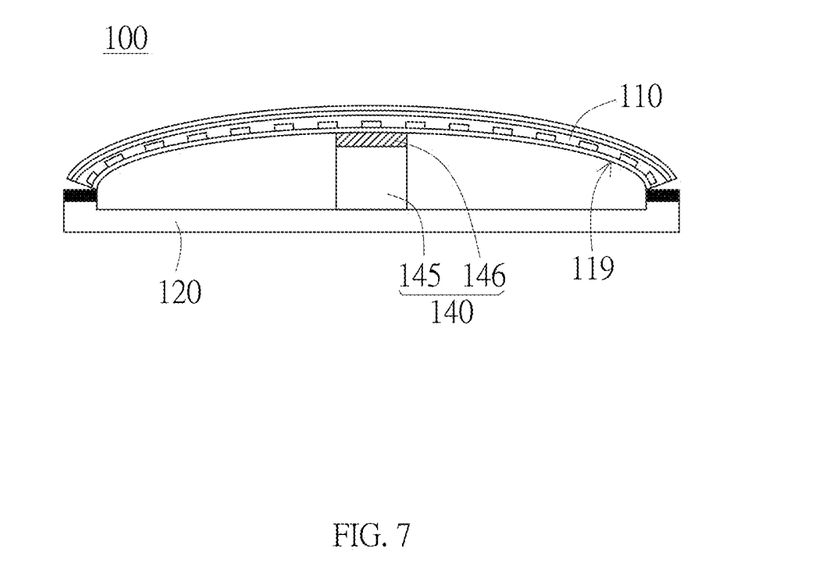
FIG. 7 is a cross-sectional view of the display device of another embodiment.

In another embodiment, as shown in FIG. 7, the spacer 140 may include a support point 145, such as screw, which protrudes from the base 120. The support point 145 can be externally provided on the base 120, or can be integrally formed on the base 120. The support point 145 may be formed in the shape of a cylinder or a square column, but not limited thereto. An elastic object 146 such as a rubber pad is provided at the top of the support point 145, and configured to connect or contact the back surface 119 of the display panel 110. The support point 145 has a greater rigidity than the elastic object 146 to provide a sufficient support strength. Through this arrangement, the protruding distance (or height) can be better maintained, and at the same time, the buffering ability of the elastic object 146 can be used to reduce damage to the back surface 119 of the display panel 110.

What is described above are only some preferred embodiments of the present disclosure. It should be noted that various changes and modifications can be made to the present disclosure without departing from the spirit and principles of the disclosure. It should be clear to those with ordinary skill in the art that the present disclosure is defined by the scope of the appended patent application, and that all possible substitutions, combinations, modifications, adaptations and other changes are within the scope of the disclosure and are consistent with the spirit of the present disclosure. The scope of the disclosure is defined by the scope of the attached patent application.

What is claimed is:
1. A display device, comprising:
a base;
a display panel provided on the base, wherein the display panel has a back surface, the back surface has a central area and a peripheral area closer to an edge of the display panel than the central area, and a shortest distance between the central area and the base is greater than a shortest distance between the peripheral area and the base; and at least one spacer disposed between the base and the back surface corresponding to the central area, wherein the spacer includes a first connecting member and a second connecting member electrically connected to each other, the first connecting member is electrically connected to a circuit on the display panel, and the second connecting member is electrically connected to a circuit on the base.

2. The display device according to claim 1, wherein the base includes a light box.

3. The display device according to claim 1, further comprising a submount, wherein the display panel is disposed on the submount, and then disposed on the base through the submount.

4. The display device according to claim 1, further comprising a plurality of connecting members configured to connect the base and the display panel, wherein the plurality of connecting members are closer to the peripheral area of the display panel than the spacer, or located at the peripheral area.

5. The display device of claim 1, wherein the back surface is rectangular and has a long side and a short side, and the central area is located in a range of 42-58% of a length of the short side from an edge of the long side and 44-56% of a length of the long side from an edge of the short side.

6. The display device of claim 1, wherein the display panel has a light-exit side, the light exit side has an optical layer, the optical layer includes a polarizer or a phase deviation film, and a transmittance of the optical layer in a light-exit direction is 40% to 60%.

7. The display device of claim 1, wherein the display panel has a light-exit side, the light-exit side has an optical layer, the optical layer includes a spectral absorption material, and a transmittance of the optical layer in a light-exit direction is 20% to 70%.

8. The display device according to claim 1, wherein the central area is located within 20% of a middle section of a surface width of the back surface.

9. The display device according to claim 1, wherein the display panel has an end surface, and the end surface is inclined relative to the base in a direction opposite to an image display direction to form an acute angle with the base.

10. A display device, comprising:
a base;
a first display panel disposed on the base; and
a second display panel disposed on the base, wherein a first side of the first display panel and a second side of the second display panel are in contact with each other, and central portions of the first display panel and of the second display panel are respectively raised relative to the base compared to the first side and the second side; and
at least one spacer disposed between the base and at least one of the first display panel and the second display panel corresponding to the central portion of the at least one of the first display panel and the second display panel,
wherein the spacer includes a first connecting member and a second connecting member electrically connected to each other, the first connecting member is electrically connected to a circuit on the at least one of the first display panel and the second display panel, and the second connecting member is electrically connected to a circuit on the base.

11. The display device according to claim 10, wherein the first display panel has a light-exit side, the light-exit side has an optical layer, the optical layer includes a polarizer or a phase deviation film, and a transmittance of the optical layer in a light-exit direction is 40% to 60%.

12. The display device according to claim 10, wherein the first display panel has a light-exit side, and the light-exit side has an optical layer, and the optical layer includes a spectral absorption material, and a transmittance of the optical layer in a light-exit direction is 20% to 70%.

13. The display device according to claim 10, wherein the first display panel has an end surface, and the end surface is inclined relative to the base in a direction opposite to an image display direction to form an acute angle with the base.

14. A display device, comprising:
a base;
a first display panel disposed on the base;
a second display panel disposed on the base, wherein a first side of the first display panel and a second side of the second display panel are in contact with each other, and a portion of the first display panel close to the first side and a portion of the second display panel close to the second side are combined to form a groove extending along the first side and the second side and having a wider top and a narrower bottom; and
at least one spacer disposed between the base and at least one of the first display panel and the second display panel corresponding to a central area of the at least one of the first display panel and the second display panel,
wherein the spacer includes a first connecting member and a second connecting member electrically connected to each other, the first connecting member is electrically connected to a circuit on the at least one of the first display panel and the second display panel, and the second connecting member is electrically connected to a circuit on the base.

15. The display device according to claim 14, wherein the first display panel has a light-exit side, the light-exit side has an optical layer, the optical layer includes a polarizer or a phase deviation film, and a transmittance of the optical layer in a light-exit direction is 40% to 60%.

16. The display device according to claim 14, wherein the first display panel has a light-exit side, and the light-exit side has an optical layer, and the optical layer includes a spectral absorption material, and a transmittance of the optical layer in a light-exit direction is 20% to 70%.

17. The display device according to claim 14, wherein the first display panel has an end surface, and the end surface is inclined relative to the base in a direction opposite to an image display direction to form an acute angle with the base.

* * * * *